US012733359B2

(12) United States Patent
Kim

(10) Patent No.: US 12,733,359 B2
(45) Date of Patent: Sep. 8, 2026

(54) LIGHT EMITTING DISPLAY DEVICE

(71) Applicant: Samsung Display Co., LTD., Yongin-si (KR)

(72) Inventor: Keun Woo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 433 days.

(21) Appl. No.: 18/389,638

(22) Filed: Dec. 19, 2023

(65) Prior Publication Data

US 2024/0381719 A1 Nov. 14, 2024

(30) Foreign Application Priority Data

May 9, 2023 (KR) ........................ 10-2023-0059808

(51) Int. Cl.
*H10K 59/131* (2023.01)
*H10K 59/121* (2023.01)

(52) U.S. Cl.
CPC ....... *H10K 59/131* (2023.02); *H10K 59/1216* (2023.02)

(58) Field of Classification Search
CPC ......................... H10K 59/131; H10K 59/1216
See application file for complete search history.

(56) References Cited

U.S. PATENT DOCUMENTS 10,157,973 B2 * 12/2018 Choi .................... H10K 59/123
10,482,817 B2 11/2019 Kim et al.
2020/0135089 A1 * 4/2020 Ji ............................ G09G 3/32
2021/0049958 A1 * 2/2021 Kim ..................... G09G 3/3283
2022/0208094 A1 * 6/2022 Jang ..................... G09G 3/3258
2022/0415273 A1 * 12/2022 Chen .................... G09G 3/3611

FOREIGN PATENT DOCUMENTS

CN 108154846 A 6/2018
CN 110969986 B 1/2021
KR 1020150064544 A 6/2015
KR 1020170132016 A 12/2017
KR 1020180064619 A 6/2018

* cited by examiner

*Primary Examiner* — Jeff W Natalini
*Assistant Examiner* — Rose Keagy
(74) *Attorney, Agent, or Firm* — CANTOR COLBURN LLP

(57) ABSTRACT

A light emitting display device includes a driving transistor including a first driving gate electrode, a second driving gate electrode, a first electrode, and a second electrode, a second transistor including a gate electrode, a first electrode connected to a data line, and a second electrode connected to the second driving gate electrode, a light emitting diode including an anode directly connected to the second electrode of the driving transistor, a storage capacitor including a first storage electrode connected to the anode of the light emitting diode and a second storage electrode connected to the second driving gate electrode, a driving voltage line directly connected to the first electrode of the driving transistor, and a light emitting control line directly connected to the first driving gate electrode.

20 Claims, 14 Drawing Sheets

FIG. 8

| Mask | |
|---|---|
| 1 | SG |
| 2 | ACT (IGZO) |
| 3 | FG |
| 4 | CNT |
| 5 | SD1 |
| 6 | 181 |
| 7 | SD2 |
| 8 | 182 |
| 9 | Anode |
| 10 | PDL |

LIGHT EMITTING DISPLAY DEVICE

This application claims priority to Korean Patent Application No. 10-2023-0059808, filed on May 9, 2023, and all the benefits accruing therefrom under 35 U.S.C. § 119, the content of which in its entirety is herein incorporated by reference.

BACKGROUND

(a) Field

The present disclosure relates to a light emitting display device, and more particularly, to a light emitting display device in which a pixel includes only a transistor including an oxide semiconductor.

(b) Description of the Related Art

The display device is a device that displays an image, and includes a type of light emitting display device, for example, a liquid crystal display (LCD), an organic light emitting diode (OLED) or the like.

Such a display device is used in various electronic devices such as mobile phones, navigation devices, digital cameras, electronic books, portable game consoles, and various terminals.

A display device such as a light emitting display device may have a bendable or foldable structure by using a flexible substrate.

Structures of pixels used in such light emitting display devices are being developed in various aspects.

SUMMARY

Embodiments are intended to provide a light emitting display device having a large number of pixels per unit area by reducing an area occupied by a pixel using an n-type transistor including an oxide semiconductor.

The embodiments are intended to reduce manufacturing cost and manufacturing time by reducing the number of masks used in forming a pixel using an n-type transistor.

A light emitting display device according to an embodiment includes a driving transistor including a first driving gate electrode, a second driving gate electrode, a first electrode, and a second electrode, a second transistor including a gate electrode, a first electrode connected to a data line, and a second electrode connected to the second driving gate electrode, a light emitting diode including an anode directly connected to the second electrode of the driving transistor, a storage capacitor including a first storage electrode connected to the anode of the light emitting diode and a second storage electrode connected to the second driving gate electrode, a driving voltage line directly connected to the first electrode of the driving transistor, and a light emitting control line directly connected to the first driving gate electrode.

In an embodiment, the driving transistor may transfer an output current to the anode of the light emitting diode based on a light emitting signal applied to the first driving gate electrode and a data voltage applied to the second driving gate electrode.

In an embodiment, the light emitting display device may further include a third transistor including a gate electrode, a first electrode connected to a reference voltage line, and a second electrode connected to the second driving gate electrode.

In an embodiment, the light emitting display device may further include a fourth transistor including a gate electrode, a first electrode connected to an initialization voltage line, and a second electrode connected to the anode and the first storage electrode.

In an embodiment, each of the driving transistor, the second transistor, the third transistor, and the fourth transistor may be an n-type transistor including an oxide semiconductor.

In an embodiment, the light emitting display device may further include a first scan line connected to the gate electrode of the second transistor; a second scan line connected to the gate electrode of the third transistor and a third scan line connected to the gate electrode of the fourth transistor.

In an embodiment, the light emitting display device may further include a first conductive layer disposed on a substrate and including the second driving gate electrode, a first insulating layer disposed on the first conductive layer, a semiconductor layer disposed on the first insulating layer and including a channel of the driving transistor, a second insulating layer disposed over the semiconductor layer, and a second conductive layer disposed on the second insulating layer and including the first driving gate electrode, where a thickness of the second insulating layer may be smaller than a thickness of the first insulating layer.

In an embodiment, the light emitting display device may further include the first conductive layer disposed on a substrate and including the first driving gate electrode, a first insulating layer disposed on the first conductive layer, a semiconductor layer disposed on the first insulating layer and including a channel of the driving transistor, a second insulating layer disposed over the semiconductor layer, and a second conductive layer disposed on the second insulating layer and including the second driving gate electrode, where a thickness of the second insulating layer may be greater than a thickness of the first insulating layer.

In an embodiment, the driving transistor may include a semiconductor layer, the semiconductor layer may be integrally formed with the first storage electrode as a single unitary and indivisible part, and the second storage electrode may be integrally formed with the second driving gate electrode as a single unitary and indivisible part.

In an embodiment, the first storage electrode of the semiconductor layer may be defined by a portion of the semiconductor layer having a conductivity to function as a conductor through an ion implantation or doping process.

A light emitting display device according to an embodiment includes a driving transistor including a first driving gate electrode, a second driving gate electrode, a first electrode, and a second electrode, a second transistor including a gate electrode, a first electrode connected to a data line, and a second electrode connected to the first driving gate electrode, a light emitting diode including an anode directly connected to the second electrode of the driving transistor, a storage capacitor including a first storage electrode connected to the anode of the light emitting diode and a second storage electrode connected to the first driving gate electrode, a driving voltage line directly connected to the first electrode of the driving transistor; and a light emitting control line directly connected to the second driving gate electrode.

In an embodiment, the driving transistor may transfer an output current to the anode of the light emitting diode based on a light emitting signal applied to the second driving gate electrode and a data voltage applied to the first driving gate electrode.

In an embodiment, the light emitting display device may further include a third transistor including a gate electrode, a first electrode connected to the reference voltage line, and a second electrode connected to the first driving gate electrode.

In an embodiment, the light emitting display device may further include a fourth transistor including a gate electrode, a first electrode connected to an initialization voltage line, and a second electrode connected to the anode and the first storage electrode.

In an embodiment, each of the driving transistor, the second transistor, the third transistor, and the fourth transistor may be a n-type transistor including an oxide semiconductor.

In an embodiment, the light emitting display device may further include a first scan line connected to the gate electrode of the second transistor, a second scan line connected to the gate electrode of the third transistor, and a third scan line connected to the gate electrode of the fourth transistor.

In an embodiment, the light emitting display device may further include a first conductive layer disposed on a substrate and including the second driving gate electrode; a first insulating layer positioned on the first conductive layer, a semiconductor layer disposed on the first insulating layer and including a channel of the driving transistor, a second insulating layer disposed over the semiconductor layer, and a second conductive layer disposed on the second insulating layer and including the first driving gate electrode, where a thickness of the second insulating layer may be smaller than a thickness of the first insulating layer.

In an embodiment, the light emitting display device may further include a first conductive layer disposed on a substrate and including the first driving gate electrode; a first insulating layer disposed on the first conductive layer, a semiconductor layer disposed on the first insulating layer and including a channel of the driving transistor, a second insulating layer disposed over the semiconductor layer, and a second conductive layer disposed on the second insulating layer and including the second driving gate electrode, where a thickness of the second insulating layer may be greater than a thickness of the first insulating layer.

In an embodiment, the driving transistor may include a semiconductor layer, the semiconductor layer may be integrally formed with the first storage electrode as a single unitary and indivisible part, and the second storage electrode may be integrally formed with the first driving gate electrode as a single unitary and indivisible part.

In an embodiment, the first storage electrode of the semiconductor layer may be defined by a portion of the semiconductor layer having a conductivity to function as a conductor through an ion implantation or doping process.

According to the embodiments, since the driving transistor has two gate electrodes and is configured to receive a light emitting signal, a separate transistor to receive the light emitting signal may not be formed, thereby reducing the area occupied by pixels and increasing the number of pixels per unit area.

According to embodiments, since an additional conductive layer may not be formed by placing one electrode of the storage capacitor on the semiconductor layer which functions as another electrode of the storage capacitor, thereby reducing manufacturing cost and manufacturing time by reducing the number of masks to be used.

BRIEF DESCRIPTION OF THE DRAWINGS

FIG. 8 is a drawing illustrating the number of masks used in manufacturing a light emitting display device according to an embodiment.

DETAILED DESCRIPTION

Figure 1:
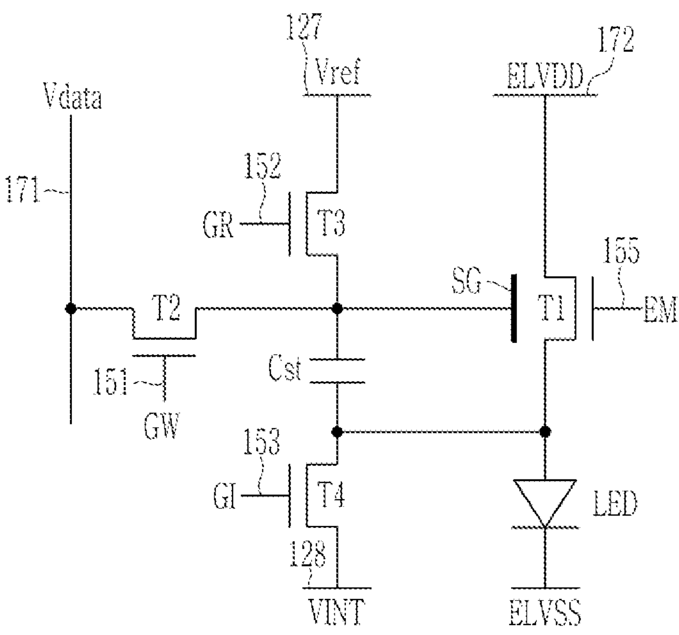
FIG. 1 is an equivalent circuit diagram of a pixel included in a light emitting display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Also, throughout the specification, when reference is made to "planar image," it means when the target part is viewed from above, and when reference is made to "cross-sectional image," it means when the cross-section of the target part cut vertically is viewed from the side.

Also, throughout the specification, when "connected" is used, this does not mean only the case where two or more constituent elements are directly connected to each other, but when two or more components are indirectly connected through another component, physically connected as well. Here, when "directly connected" is used, this means the case where two or more constituent elements are connected to each other via a conductive element or line, without any electrical element connected therebetween. In the case of being connected or electrically connected, as well as being referred to by different names depending on location or function, each part that is substantially integral may be connected to each other.

In addition, throughout the specification, when a portion such as a wiring, layer, film, region, plate, component, etc., "extends in a first direction or a second direction," it means not only a straight line extending in the corresponding direction. Instead, it is a structure that generally extends along the first direction or the second direction, and includes a structure that is bent at one part, has a zigzag structure, or extends while including a curved structure.

In addition, electronic devices (e.g., mobile phones, TVs, monitors, notebook computers) including display devices and display panels described in the specification or display devices and display panels manufactured by the manufacturing method described in the specification are not excluded from the scope of the present specification.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

First, a circuit structure of a pixel using an n-type transistor including an oxide semiconductor will be described through FIG. 1.

FIG. 1 is an equivalent circuit diagram of a pixel included in a light emitting display device according to an embodiment.

In an embodiment, as shown in FIG. 1, a pixel may include a plurality of transistors T1, T2, T3, T4 connected to various wires 127, 128, 151, 152, 153, 155, 171, 172, a storage capacitor Cst (hereinafter, also referred to as "first capacitor"), and a light emitting diode LED.

Here, transistors and capacitors other than the light emitting diode LED constitute a pixel circuit unit, and the pixel may include a pixel circuit unit and the light emitting diode LED.

In an embodiment shown in FIG. 1, all of the plurality of transistors T1, T2, T3, T4 may be n-type transistors.

In such an embodiment, the n-type transistor may include or be formed of an oxide semiconductor transistor including an oxide semiconductor.

The n-type transistor may be a transistor that is turned on when a relatively high voltage is applied to a gate electrode.

A plurality of wires 127, 128, 151, 152, 153, 155, 171, 172 are connected to the pixel.

The plurality of wires include a reference voltage line 127, an initialization voltage line 128, a first scan line 151, a second scan line 152, a third scan line 153, an emission control line (also referred to as "light emitting control line") 155, a data line 171, and a driving voltage line 172.

Additionally, a common voltage line for transmitting the driving low voltage ELVSS may be connected to one side of the light emitting diode LED.

The first scan line 151 transmits a first scan signal GW to a gate electrode of the second transistor T2, and the second scan line 152 transmits a second scan signal GR to a gate electrode of the third transistor T3.

The third scan line 153 transmits a third scan signal GI to a gate electrode of the fourth transistor T4, and the emission control line 155 transmits an emission signal EM to the first transistor of the driving transistor T1 to a gate electrode.

The data line 171 is a wire that transmits a data voltage Vdata generated by a data driver (not shown) of the light emitting display device, and accordingly, the amount of the output current delivered to the light emitting diode LED is changed so that the light emitting diode LED emits light, and luminance also changes.

The driving voltage line 172 applies a driving voltage ELVDD.

The reference voltage line 127 transfers a reference voltage Vref, and the initialization voltage line 128 transfers an initialization voltage VINT.

In an embodiment, voltages applied to the driving voltage line 172, the reference voltage line 127, and the initialization voltage line 128 may be constant voltages.

In an embodiment, the driving transistor T1 (hereinafter, also referred to as "first transistor") is an n-type transistor, and has an oxide semiconductor as a semiconductor layer.

The driving transistor T1 includes two gate electrodes, e.g., a first gate electrode and a second gate electrode.

The first gate electrode (hereinafter, also referred to as "first driving gate electrode") of the driving transistor T1 receives the light emitting signal EM from the emission line (or light emitting control line) 155 and causes the light emitting diode LED to emit light based on the amount of the voltage, that is, the voltage stored in the storage capacitor Cst, of the second gate electrode SG (hereinafter, also referred to as a second driving gate electrode) of the driving transistor T1, the amount of an output current output from the driving transistor T1 to one electrode (e.g., anode) of the light emitting diode LED is adjusted.

The amount of the output current output to the one electrode (anode) of the light emitting diode LED may be adjusted based on the data voltage Vdata applied to the pixel.

In such an embodiment, a first electrode of the driving transistor T1 is connected to the driving voltage line 172 to receive the driving voltage ELVDD, and a second electrode of the driving transistor T1 is connected to the one electrode (anode) of the light emitting diode LED, and outputs an output current to the light emitting diode LED.

The data voltage Vdata is applied to the second driving gate electrode SG of the driving transistor T1 through the second transistor T2.

In such an embodiment, the second driving gate electrode SG of the driving transistor T1 is connected to one electrode (hereinafter, referred to as "second storage electrode") of the storage capacitor Cst.

The voltage of the second driving gate electrode SG of the driving transistor T1 is changed based on the voltage stored in the storage capacitor Cst, and the output current output from the driving transistor T1 is changed accordingly.

The storage capacitor Cst serves to keep or maintain the voltage of the second driving gate electrode SG of the driving transistor T1 to be constant for one frame (or one frame period).

In an embodiment, the second driving gate electrode SG of the driving transistor T1 may also be connected to the third transistor T3 to be initialized by receiving the reference voltage Vref.

Figure 7:
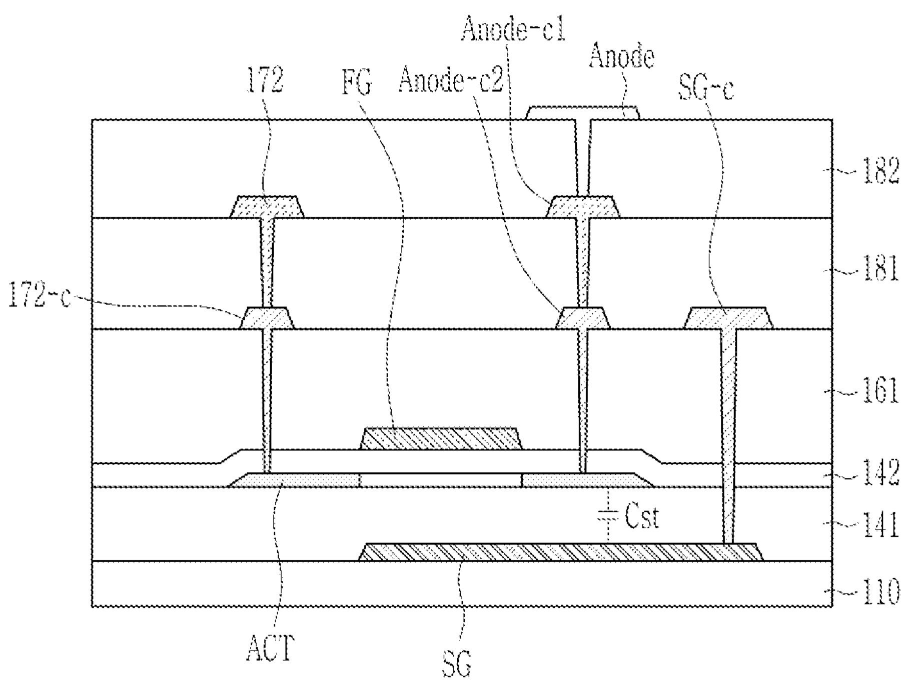
FIG. 7 is a cross-sectional view of a light emitting display device according to an embodiment.

Referring to FIG. 7, according to an embodiment, the second driving gate electrode SG may overlap a channel positioned on a semiconductor layer and may be positioned between a substrate and the semiconductor layer.

Referring back to FIG. 1, the first driving gate electrode of the driving transistor T1 is connected to the emission line (or light emitting control line) 155, and the second electrode of the driving transistor T1 is directly connected to the one electrode (e.g., anode) of the light emitting diode LED, a second electrode of the fourth transistor T4, and another electrode (hereinafter, referred to as "first storage electrode") of the storage capacitor Cst.

The driving transistor T1 is turned on by the positive polarity voltage of the light emission signal EM flowing through the emission control line 155, and at this time, the output current determined by the voltage of the second driving gate electrode SG may be output to the one electrode (e.g., anode) of the light emitting diode LED.

The second transistor T2 is an n-type transistor and has an oxide semiconductor as a semiconductor layer.

The second transistor T2 is a transistor that receives the data voltage Vdata into the pixel.

A gate electrode of the second transistor T2 is connected to the first scan line 151.

A first electrode of the second transistor T2 is connected to the data line 171, and a second electrode of the second transistor T2 is connected to the second driving gate electrode SG of the driving transistor T1, the second electrode of the third transistor T3, and the second storage electrode of the storage capacitor Cst.

When the second transistor T2 is turned on by the positive polarity voltage of the first scan signal GW transmitted through the first scan line 151, the data voltage Vdata transmitted through the data line 171 is transmitted to the second driving gate electrode SG of the driving transistor T1, and at this time, the data voltage Vdata is stored in the second storage electrode of the storage capacitor Cst.

In an alternative embodiment, although not shown in FIG. 1, a boost capacitor, which is a kind of parasitic capacitor, may be further provided between the first scan line 151 and the second driving gate electrode SG of the driving transistor T1 or the second storage electrode of the storage capacitor Cst or the third transistor T3.

The third transistor T3 is an n-type transistor, and has an oxide semiconductor as a semiconductor layer.

The third transistor T3 serves to transfer the reference voltage Vref to the driving gate electrode of the driving transistor T1 and the second storage electrode of the storage capacitor Cst.

The gate electrode of the third transistor T3 is connected to the second scan line 152, and a first electrode of the third transistor T3 is connected to the reference voltage line 127.

A second electrode of the third transistor T3 is connected to the second storage electrode of the storage capacitor Cst, the second driving gate electrode SG of the driving transistor T1, and the second electrode of the second transistor T2.

The third transistor T3 is turned on by the positive polarity voltage of the second scan signal GR received through the second scan line 152, and at this time, the reference voltage Vref is applied to the voltage of the driving transistor T1 such that the pixel is initialized by transmission of the reference voltage Vref to the second driving gate electrode SG and the second storage electrode of the storage capacitor Cst.

The fourth transistor T4 is an n-type transistor, and has an oxide semiconductor as a semiconductor layer.

The fourth transistor T4 serves to initialize the one electrode (e.g., anode) of the light emitting diode LED.

Hereinafter, the fourth transistor T4 is also referred to as a light emitting diode initialization transistor.

When the one electrode anode of the light emitting diode LED is initialized, the fourth transistor T4 also initializes the first storage electrode of the storage capacitor Cst.

The gate electrode of the fourth transistor T4 is connected to the third scan line 153, a second electrode of the fourth transistor T4 is connected to the one electrode of the light emitting diode LED and the first storage electrode of the storage capacitor Cst, and a first electrode of the fourth transistor T4 is connected to the initialization voltage line 128.

When the fourth transistor T4 is turned on by the positive polarity voltage of the third scan signal GI flowing through the third scan line 153, the initialization voltage VINT is applied to the one electrode of the light emitting diode LED and the first storage electrode of the storage capacitor Cst to be initialized.

In an embodiment, not only the driving transistor T1 but also the other transistors T2, T3, T4 may be positioned between the semiconductor layer and the substrate, and may have overlapping electrodes overlapping a channel of the semiconductor layer corresponding thereto.

In such an embodiment, in all transistors T2, T3, T4 except for the driving transistor T1, each overlapping electrode may be electrically connected to a gate electrode, and each overlapping electrode may be electrically connected to another gate electrode (hereinafter, referred as a dual gate electrode).

In an embodiment, as described above, all transistors T1, T2, T3, T4 include or are formed of n-type transistors and use an oxide semiconductor as a semiconductor layer.

The first storage electrode of the storage capacitor Cst is connected to the second electrode of the fourth transistor T4, the second electrode of the driving transistor T1, and the one electrode (e.g., anode) of the light emitting diode LED, and the second storage electrode of the storage electrode is connected to the second driving gate electrode SG of the driving transistor T1, the second electrode of the third transistor T3, and the second electrode of the second transistor T2.

The storage capacitor Cst serves to keep or maintain the voltage of the second driving gate electrode SG of the driving transistor T1 to be constant for one frame.

In an embodiment, as shown in FIG. 1, the pixel may include only four transistors T1 to T4 and additionally includes one capacitor (storage capacitor Cst), but is not limited thereto. Alternatively, a boost capacitor connected between the scan line 151 and the second driving gate electrode SG of the driving transistor T1 or the second storage electrode of the storage capacitor Cst may also be included in the pixel.

In an alternative embodiment, another parasitic capacitor may be further included in the pixel.

In the above, the circuit structure of a pixel according to an embodiment has been described with reference to FIG. 1.

Hereinafter, the waveform of the signals applied to the pixel of FIG. 1 and corresponding operations of the pixel will be described with reference to FIG. 2 to FIG. 6.

Figure 2:
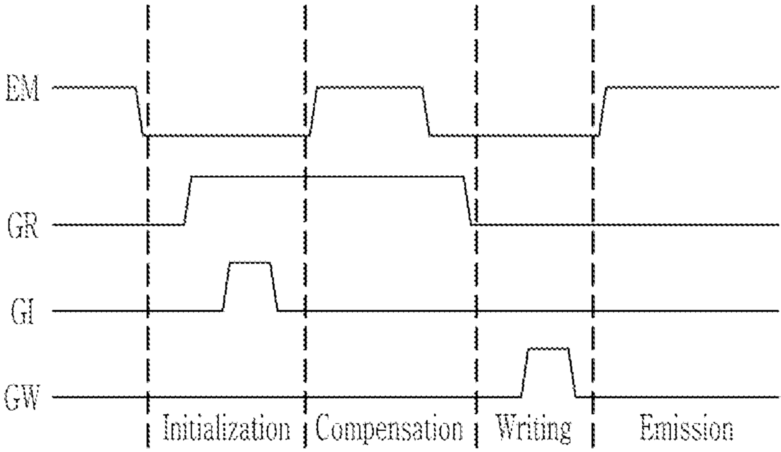
FIG. 2 is a waveform diagram showing signals applied to the pixel of FIG. 1.

FIG. 2 is a waveform diagram showing signals applied to the pixel of FIG. 1, and FIG. 3 to FIG. 6 are diagrams sequentially showing operations of the pixels of FIG. 1.

First, referring to FIG. 2, a signal applied to the pixel (or a light emitting period of the pixel) is divided into sections or period, the signal may be divided into an initialization section (also referred to as "initialization period"), a compensation section (also referred to as "compensation period"), a writing section (also referred to as "writing period"), and an emission section (also referred to as "emission period").

The gate-on voltage and the gate-off voltage may be different depending on the type of transistor to which the voltage is applied, whether it is a high voltage or a low voltage. For an n-type transistor, a high voltage may be a gate-on voltage, and a low voltage may be a gate-off voltage.

On the other hand, depending on embodiments, when changing from a low voltage to a high voltage, the voltage of the signal may increase in such a way that the voltage of the signal increases two or more times.

Figure 6:
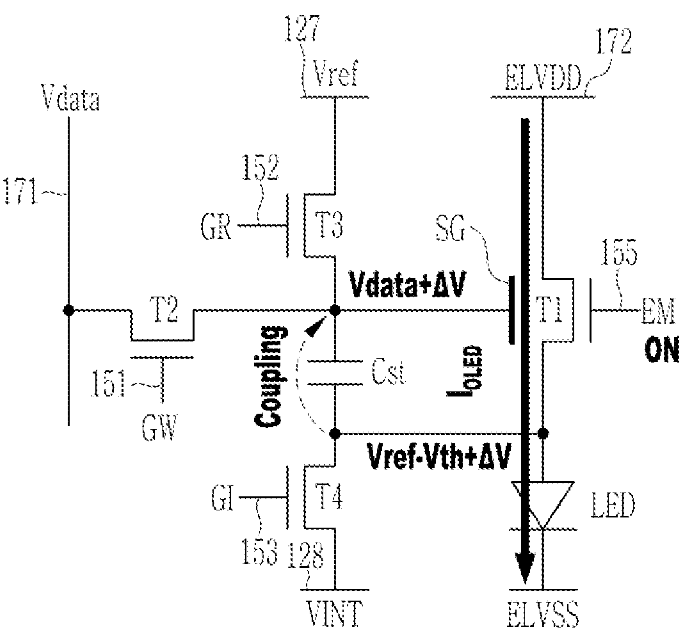

First, the emission period (or light emitting period) is a section during which the light emitting diode LED emits light while an output current flows through the light emitting diode LED as shown in FIG. 6.

Referring to FIG. 2, a gate-on voltage of the light emitting signal EM is applied in the emission period, the driving transistor T1 is turned on, and an output current is output from the driving transistor T1 to the light emitting diode LED.

In the emission period, all other signals (the second scan signal GR, the third scan signal GI, and the first scan signal GW) have gate-off voltages.

When the driving transistor T1 is turned on, an output current having a size determined based on the voltage of the second driving gate electrode SG of the driving transistor T1 is generated and output to the light emitting diode LED.

In FIG. 2, the emission period in which the emission signal EM applies the gate-on voltage is shown arbitrarily for convenience of illustration, but in reality, the emission period may have the longest time.

However, since the emission period performs only the simple operation described above, it is simply shown in FIG. 2 without further explanation.

Figure 3:
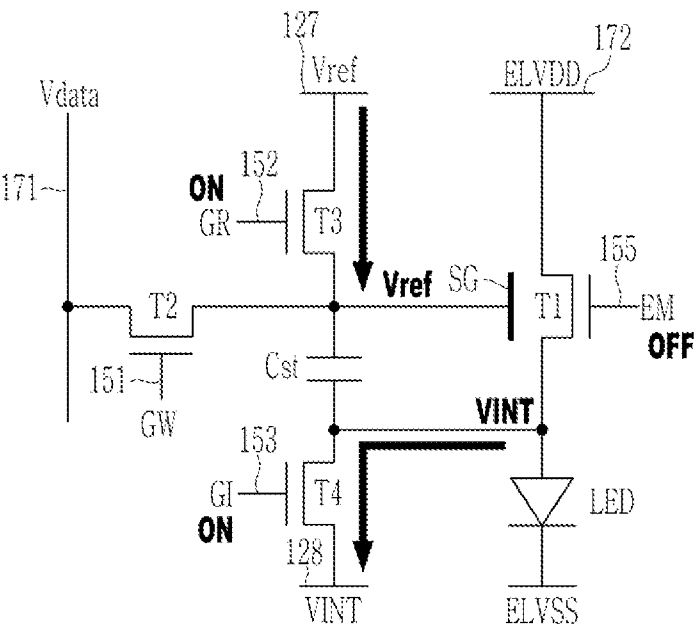
FIG. 3 to FIG. 6 are drawings sequentially showing operations of the pixels of FIG. 1.

When the emission period ends, the initialization period begins, and in the initialization period, operation of the pixel is performed as shown in FIG. 3.

Referring to FIG. 2, the emission period ends as the emission signal EM is changed to the gate-off voltage.

After that, the second scan signal GR is changed to the gate-on voltage, and then the third scan signal GI is also changed to the gate-on voltage during the initialization period.

At this time, the emission signal EM and the first scan signal GW maintain a gate-off voltage.

Referring to FIG. 3, in the initialization period, first, the third transistor T3 receiving the second scan signal GR is turned on.

The reference voltage Vref is transferred to the second driving gate electrode SG of the driving transistor T1 and the second storage electrode of the storage capacitor Cst by the turned-on third transistor T3 to initialize the second driving gate electrode SG of the driving transistor T1 and the second storage electrode of the storage capacitor Cst.

Here, the reference voltage Vref may have a voltage value that does not turn on the driving transistor T1.

Then, the fourth transistor T4 receiving the third scan signal GI is turned on, and the fourth transistor T4 connects one electrode (anode) of the light emitting diode LED and the storage capacitor Cst to each other. The initialization voltage VINT is transferred to the first storage electrode of the storage capacitor Cst and the second electrode of the driving transistor T1 to initialize them.

Referring to the direction of the arrow in FIG. 3, the initialization voltage VINT has a low voltage level, so that the charge accumulated in one electrode (anode) of the light emitting diode LED, the first storage electrode of the storage capacitor Cst, and the second storage electrode of the driving transistor T1 are discharged to the first electrode of the fourth transistor T4, and the direction is shown considering such a flow of current.

Referring to FIG. 2, after the third scan signal GI is changed to a gate-off voltage, the emission signal EM is changed to a gate-on voltage and enters a compensation period.

At this time, the second scan signal GR is maintained at the gate-on voltage, and the first scan signal GW is maintained at the gate-off voltage.

Figure 4:
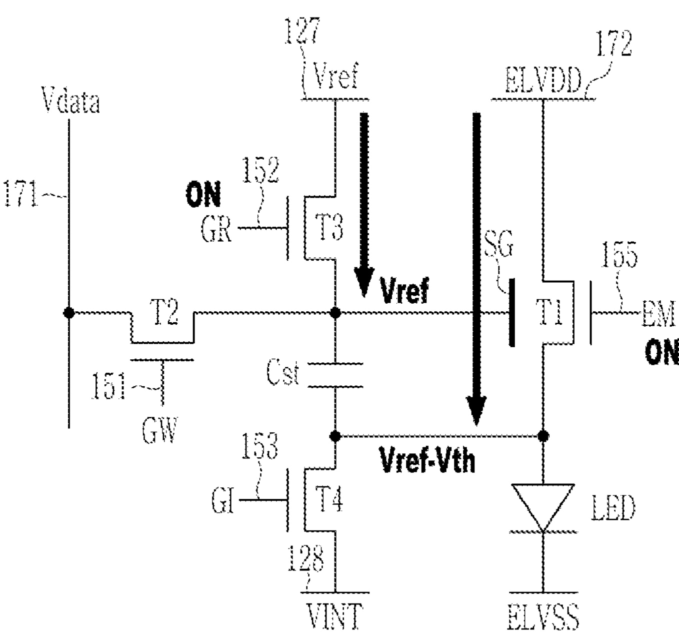

Referring to FIG. 4, in the compensation period, the driving transistor T1 is turned on by the emission signal EM, and the driving voltage ELVDD passes through the second electrode of the driving transistor T1 to the first storage electrode of the storage capacitor Cst.

Specifically, in the initialization period, the voltage of the first storage electrode of the storage capacitor Cst is charged to the initialization voltage VINT, the second storage electrode of the storage capacitor Cst and the second driving gate of the driving transistor T1. The voltage of the electrode SG is charged to the reference voltage Vref.

In this state, since the driving transistor T1 is turned on by the emission signal EM, the driving voltage ELVDD transmitted to the first electrode of the driving transistor T1 is transmitted to the first electrode of the storage capacitor Cst, and the voltage of the first storage electrode increases.

When the voltage of the first storage electrode increases and is lower than the voltage of the second driving gate electrode SG of the driving transistor T1 by the threshold voltage Vth, the driving transistor T1 is turned off, and the voltage at that time is stored in the first storage electrode of the storage capacitor Cst.

Since the voltage of the second driving gate electrode SG of the driving transistor T1 has the reference voltage Vref, the voltage value of the first storage electrode of the storage capacitor Cst at this time may satisfy Equation 1 below.

$$\text{voltage of the first storage electrode} = Vref - Vth \quad \text{[Equation 1]}$$

After that, referring to FIG. 2, after the emission signal EM is changed to the gate-off voltage, the second scan signal GR is also changed to the gate-off voltage and enters the writing period.

In the writing period, the first scan signal GW may be applied as a gate-on voltage for 1H, and the first scan signal GW can sequentially apply the gate-on voltage to the first scan line 151 of each row.

Figure 5:
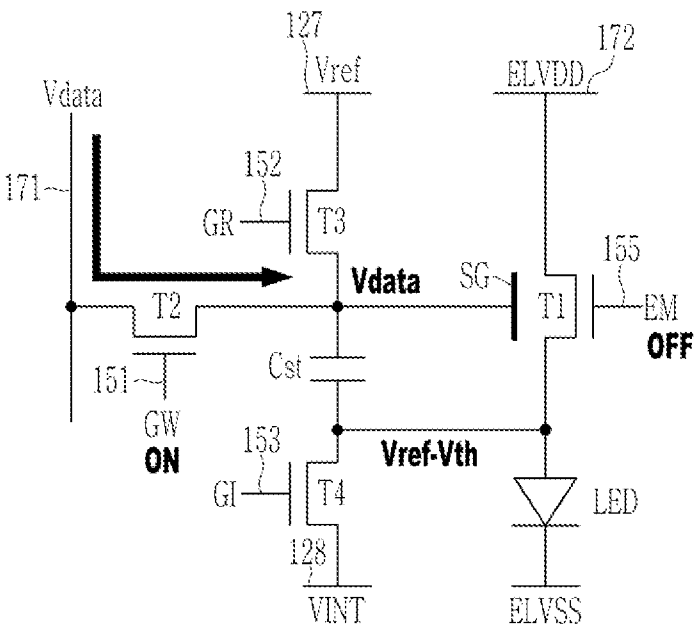

Referring to FIG. 5, the second transistor T2 is turned on by the gate-on voltage of the first scan signal GW, and the data voltage Vdata is turned on by the turned-on second transistor T2 to the driving transistor. The voltage is transferred to the second driving gate electrode SG of T1 and the second storage electrode of storage capacitor Cst.

Since the voltage of the second storage electrode of the storage capacitor Cst is changed, the voltage of the first storage electrode of the storage capacitor Cst may also change in proportion thereto.

However, in FIG. 5, the voltage value of the first storage electrode of the storage capacitor Cst is described as the same as the voltage value of Equation 1, which means that the voltage value of the first storage electrode of the storage capacitor Cst in the writing period may be so small as to be negligible.

In addition, the operation of the driving transistor T1 is determined by the voltage value of the second driving gate electrode SG, and there is no problem in explaining the operation of the driving transistor T1 by the change in the voltage value of the first storage electrode of the storage capacitor Cst affects the operation of the driving transistor T1, and it is described in the same way as in Equation 1.

After that, referring to FIG. 2, the emission signal EM is changed to the gate-on voltage and enters the emission period.

Referring to FIG. 6, in the emission period, the gate-on voltage of the emission signal EM is applied and the driving transistor T1 is turned on, the driving transistor T1 is turned on based on the voltage value of the second driving gate electrode SG of the driving transistor T1, and a predetermined output current is output to the second electrode of the driving transistor T1.

Specifically, when the driving transistor T1 is turned on, the voltage of the second electrode of the driving transistor T1 and the first storage electrode of the storage capacitor Cst connected thereto increases.

As the voltage of the first storage electrode of the storage capacitor Cst increases, the voltage value of the second storage electrode of the storage capacitor Cst also increases due to coupling.

In FIG. 6, both the voltage value at which the voltage of the first storage electrode of the storage capacitor Cst rises and the voltage value at which the voltage of the second storage electrode of the storage capacitor Cst increases due to coupling are both ΔV (hereinafter, also referred to as "voltage fluctuation value" or "voltage fluctuation value" of the emission period).

In an alternative embodiment, the voltage value at which the voltage of the second storage electrode of the storage capacitor Cst rises may have a value smaller than ΔV.

In such an embodiment, the voltage value of the second driving gate electrode SG of the driving transistor T1 may satisfy Equation 2 below.

$$\text{voltage value of the second driving gate electrode} = Vdata + \Delta V \quad \text{[Equation 2]}$$

According to the voltage value of the second driving gate electrode SG of the driving transistor T1 raised as in Equation 2, the driving transistor T1 generates an output current and outputs the output current to one electrode (anode) of the light emitting diode LED and, as the output current flows through the light emitting diode LED, the light emitting diode LED emits light with a luminance corresponding to the amount of the output current.

At this time, since the voltage value of the second driving gate electrode SG of the driving transistor T1 has a value independent of the threshold voltage Vth of the driving transistor T1, the threshold voltage of each driving transistor T1 even if the Vth value is varied, the output current value is not affected, so the display quality is effectively maintained to be constant.

In an embodiment, the driving voltage ELVDD is a positive high voltage value and may have a value of 5 volts (V) or greater and 10 V or less, and the driving low voltage ELVSS may have a voltage value equivalent to 0 V.

In an embodiment, the reference voltage Vref may have a positive voltage value, and the initialization voltage VINT may have a negative voltage value, and a median value between the voltage value of the reference voltage Vref and the voltage value of the initialization voltage VINT may correspond to a voltage value of the driving low voltage ELVSS.

In the above, the circuit structure and operation of the pixel have been described with reference to FIG. 1 to FIG. 6.

Hereinafter, a schematic cross-sectional structure of a pixel will be described with reference to FIG. 7.

FIG. 7 is a cross-sectional view of a light emitting display device according to an embodiment.

FIG. 7 illustrates a stacked structure from a substrate 110 to an anode of the light emitting diode LED in an embodiment of the light emitting display device.

In FIG. 7, a pixel circuit unit including a transistor and a capacitor among pixels may be positioned under the anode.

Hereinafter, the cross-sectional structure of FIG. 7 will be described in detail.

Referring to FIG. 7, a second driving gate electrode SG included in (or defined by portions of) a first conductive layer is disposed or formed on the substrate 110.

A portion of the second driving gate electrode SG may constitute the second storage electrode of the storage capacitor Cst, so that the second driving gate electrode SG and the second storage electrode may be integrally formed with each other as a single unitary and indivisible part.

A portion of the second driving gate electrode SG overlapping the channel of the semiconductor layer ACT serves as the second driving gate electrode SG of the driving transistor T1, and other portion of the second driving gate electrode SG not overlapping the channel of the semiconductor layer ACT may serve as a second storage electrode.

A first insulating layer 141 is disposed on the substrate 110 to cover the first conductive layer, and the first insulating layer 141 may include or be formed of an inorganic insulating material.

The semiconductor layer ACT is disposed or positioned on the first insulating layer 141.

The semiconductor layer ACT may include or be formed of an oxide semiconductor.

In the semiconductor layer ACT, a first region and a second region corresponding to the first electrode and the second electrode are positioned on opposing sides of a channel (or a channel region) formed therein.

Except for the channel, the semiconductor layer ACT may have conductivity characteristics comparable to those of a conductor through an ion implantation or doping process, and the first and second regions also have conductivity characteristics similar to those of a conductor, such that the first and second regions correspond to (or function as) the first electrode and the second electrode.

Here, the channel may be disposed or positioned in a portion of the semiconductor layer ACT overlapping the first driving gate electrode FG.

In addition, the first storage electrode of the storage capacitor Cst may be disposed or formed on a portion of the semiconductor layer ACT, so that the semiconductor layer ACT and the first storage electrode may be integrally formed with each other as a single unitary and indivisible part.

The semiconductor layer ACT constituting the first storage electrode may be positioned in a portion having conductivity characteristics comparable to those of a conductor through an ion implantation or doping process.

The channel of the semiconductor layer ACT overlaps the first driving gate electrode FG, and the first storage electrode positioned on the semiconductor layer ACT and the second storage electrode positioned on the second driving gate electrode SG are mutually connected to each other. Since they overlap, the first driving gate electrode FG may not overlap the first storage electrode or the second storage electrode.

A second insulating layer 142 is disposed or positioned on the first insulating layer 141 to cover the semiconductor layer ACT, and the second insulating layer 142 may include or be formed of an inorganic insulating material.

Here, the thickness of the second insulating layer 142 may be relatively thinner than the thickness of the first insulating layer 141.

The first insulating layer 141 may be formed thickly so that a layer (e.g., the semiconductor layer ACT) positioned on top thereof may be formed on a flat surface without a step, and the second insulating layer 142 may be formed thinly positioned on top of the insulating layer 141, and a layer e.g., the first driving gate electrode FG may be formed with a step.

A first driving gate electrode FG included in (or defined by portions of) a second conductive layer is disposed or formed on the second insulating layer 142.

A detailed cross-sectional structure of the driving transistor T1 having two gate electrodes will hereinafter be described in detail.

The first driving gate electrode FG and the second driving gate electrode SG are positioned above and below the semiconductor layer ACT of the driving transistor T1 to be insulated from each other.

The relatively thin second insulating layer 142 is positioned between the first driving gate electrode FG and the semiconductor layer ACT, and the relatively thick first insulating layer 141 is positioned between the second driving gate electrode SG and the semiconductor layer ACT.

In such an embodiment, the first driving gate electrode FG of the driving transistor T1 is positioned relatively close to the semiconductor layer ACT and can serve as a main gate electrode.

In such an embodiment, the second driving gate electrode SG of the driving transistor T1 is positioned relatively far from the semiconductor layer ACT and may serve as an auxiliary gate electrode.

In an embodiment, the second insulating layer 142 may be positioned only under the first driving gate electrode FG.

In an embodiment, the second insulating layer 142 may have substantially a same width as the first driving gate electrode FG, and when the first driving gate electrode FG is etched, the second insulating layer 142 is also etched. In such an embodiment, the second insulating layer 142 may be positioned only under the gate electrode FG.

A third insulating layer 161 is disposed to cover the second conductive layer including the first driving gate electrode FG, and an opening is defined or formed in at least one of the third insulating layer 161, the second insulating layer 142, the first insulating layer 141.

Openings defined in the third insulating layer 161 and the second insulating layer 142 expose opposing sides of the semiconductor layer ACT, respectively, and the third insulating layer 161, the second insulating layer 142, and the first insulating layer 141 may expose the second driving gate electrode SG.

A plurality of connecting electrodes 172-*c*, Anode-c2, SG-c included in (or defined by portions of) a third conductive layer are disposed or positioned on the third insulating layer 161.

The connecting electrode 172-*c* connects the driving voltage line 172 and a portion of the semiconductor layer ACT to each other, and the connecting electrode SG-c connects the second driving gate electrode SG to a portion of another transistor e.g., a semiconductor layer, or one electrode of another transistor to each other, and the connecting electrode Anode-c2 connects a portion of the semiconductor layer ACT to one electrode Anode of the light emitting diode LED.

Referring to FIG. 7, a first organic layer 181 is disposed or positioned on the third conductive layer.

An opening exposing a portion of the third conductive layer is defined or formed in the first organic layer 181.

In an embodiment of FIG. 7, the connecting electrode 172-*c* and the connecting electrode Anode-c2 are exposed through an opening defined in the first organic layer 181.

A fourth conductive layer is disposed or positioned on the first organic layer 181, and the fourth conductive layer may include (or portions of the fourth conductive layer may define) a driving voltage line 172 and an anode connecting electrode Anode-c1.

The driving voltage line 172 is connected to the connecting electrode 172-*c* through an opening defined or formed in the first organic layer 181, and is electrically connected to a portion of the semiconductor layer ACT of the driving transistor T1.

In an embodiment, the anode connecting electrode Anode-c1 is connected to the connecting electrode Anode-c2 through an opening defined in the first organic layer 181, and is electrically connected to another part of the semiconductor layer ACT of the driving transistor T1.

A second organic layer 182 is disposed or formed on the fourth conductive layer.

An opening exposing the anode connecting electrode Anode-c1 of the fourth conductive layer is defined or formed in the second organic layer 182.

An anode Anode, which is one electrode of a light emitting diode LED, is disposed or formed on the second organic layer 182.

The anode Anode is connected to the anode connecting electrode Anode-c1 through an opening defined in the second organic layer 182, is also electrically connected to a portion of the semiconductor layer ACT of the driving transistor T1, and receives the output current of the driving transistor T1.

In an embodiment, as shown in FIG. 7, the connection structure to the driving voltage line 172 and the anode Anode is formed using two conductive layers, e.g., the third conductive layer and the fourth conductive layer, but not being limited thereto. Alternatively, only one conductive layer may be used to form the driving voltage line 172 and a connection structure to the anode Anode.

In such an embodiment, the first organic layer 181 or the second organic layer 182 may be omitted.

Although additional structure above the anode Anode is not shown in FIG. 7, additional structure may be provided or formed as described below.

The planar structure of the anode Anode may vary, and a pixel defining layer (see PDL in FIG. 8) with an opening exposing a portion of the anode may be provided on the second organic layer 182.

An emission layer may be provided within the opening of the pixel defining layer, and a cathode, which is another electrode of the light emitting diode LED, may be provided on the pixel defining layer and the light emitting layer.

A spacer may also be provided above the pixel defining layer and below the cathode.

An encapsulation layer may be provided on the cathode, and the encapsulation layer includes at least one inorganic layer and at least one organic layer, and may include a first inorganic encapsulation layer, an organic encapsulation layer, and a second inorganic encapsulation layer according to an embodiment.

The encapsulation layer may be a layer for protecting the emission layer from moisture or oxygen that may be inflowed from the outside.

In an embodiment, the encapsulation layer may include a structure in which an inorganic layer and an organic layer are sequentially stacked.

In an embodiment, a component enabling touch sensing may be further provided on the encapsulation layer, and a configuration such as a light blocking layer or a color filter may be further included.

In an embodiment, a color conversion layer including quantum dots may be included instead of a color filter, or a reflection control layer may be included.

In an embodiment, the same number of masks as shown in FIG. 8 may be used in manufacturing a light emitting display device to form the structure shown in FIG. 7.

FIG. 8 is a diagram illustrating the number of masks used in manufacturing a light emitting display device according to an embodiment.

The numbers described in FIG. 8 are mask numbers according to the order of the process, and the mask with the previous number indicates that the mask is used first in the manufacturing process.

Referring to FIG. 8, mask 1 is a mask for forming the first conductive layer including the second driving gate electrode SG, and mask 2 is a mask for forming the semiconductor layer ACT. The semiconductor layer ACT may be an oxide semiconductor including indium gallium zinc oxide (IGZO).

Mask 3 is a mask for forming the second conductive layer including the first driving gate electrode FG, and mask 4 is a mask for forming an opening for the contact CNT in the third insulating layer 161 and the insulating layer therebelow.

Mask 5 is a mask for forming the third conductive layer SD1, and mask 6 is a mask for forming an opening in the first organic layer 181.

Mask 7 is a mask for forming the fourth conductive layer SD2, and mask 8 is a mask for forming an opening in the second organic layer 182.

Mask 9 is a mask for forming an anode, and mask 10 is a mask for forming a pixel defining layer PDL.

In such an embodiment, after forming the pixel defining layer PDL, an emission layer, a cathode, an encapsulation layer, and the like may be formed without using a mask.

In an embodiment of FIG. 7, the storage capacitor Cst is formed between the first conductive layer and the semiconductor layer ACT, so that no additional conductive layer is formed.

That is, in a comparative example in which the storage capacitor is formed between two adjacent conductive layers, an additional conductive layer may be formed between the second conductive layer and the third conductive layer.

In an embodiment of the invention, no additional conductive layer is formed between the second conductive layer and the third conductive layer, and a portion of the semiconductor layer ACT is used as the first storage electrode of the storage capacitor Cst, thereby reducing at least one of the masks.

As a result, the cost to manufacture masks can be reduced, and the time for manufacturing can be reduced by reducing the number of process steps.

Hereinafter, characteristics of the driving transistor T1 including two gate electrodes will be described in detail with reference to FIGS. 9 to 11.

Figure 9:
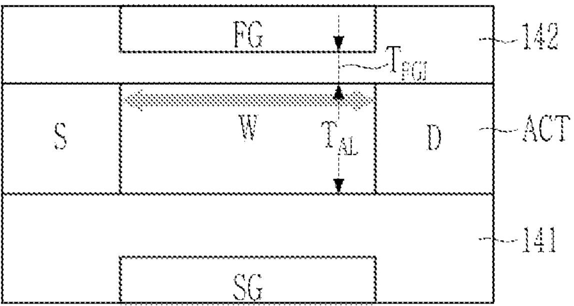
FIG. 9 is a schematic cross-sectional view of a driving transistor according to an embodiment.

First, reference is made to reference numerals assigned to the cross-sectional structure of the driving transistor T1 with reference to FIG. 9.

FIG. 9 is a schematic cross-sectional view of a driving transistor according to an embodiment.

Referring to FIG. 9, in an embodiment, the semiconductor layer ACT includes a channel having a channel width W and a source region S, and a drain region D positioned on opposing sides of the channel.

Here, the thickness of the semiconductor layer ACT is referred to as $T_{AL}$.

The thickness of the second insulating layer 142 positioned between the semiconductor layer ACT and the first driving gate electrode FG is referred to as $T_{FGI}$, and the thickness between the semiconductor layer ACT and the second driving gate electrode SG, which is substantially the same as the thickness of the first insulating layer 141, is referred to as $T_{SGI}$.

Characteristics of the driving transistor T1 will be described with reference to FIG. 10 and FIG. 11 together with FIG. 9.

Figure 10:
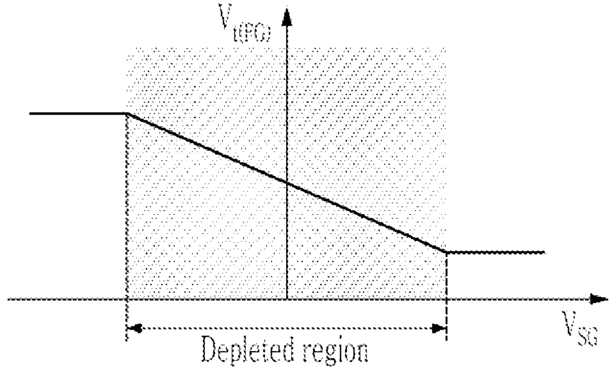
FIG. 10 and FIG. 11 are graphs showing characteristics of a driving transistor according to an embodiment.
Figure 11:
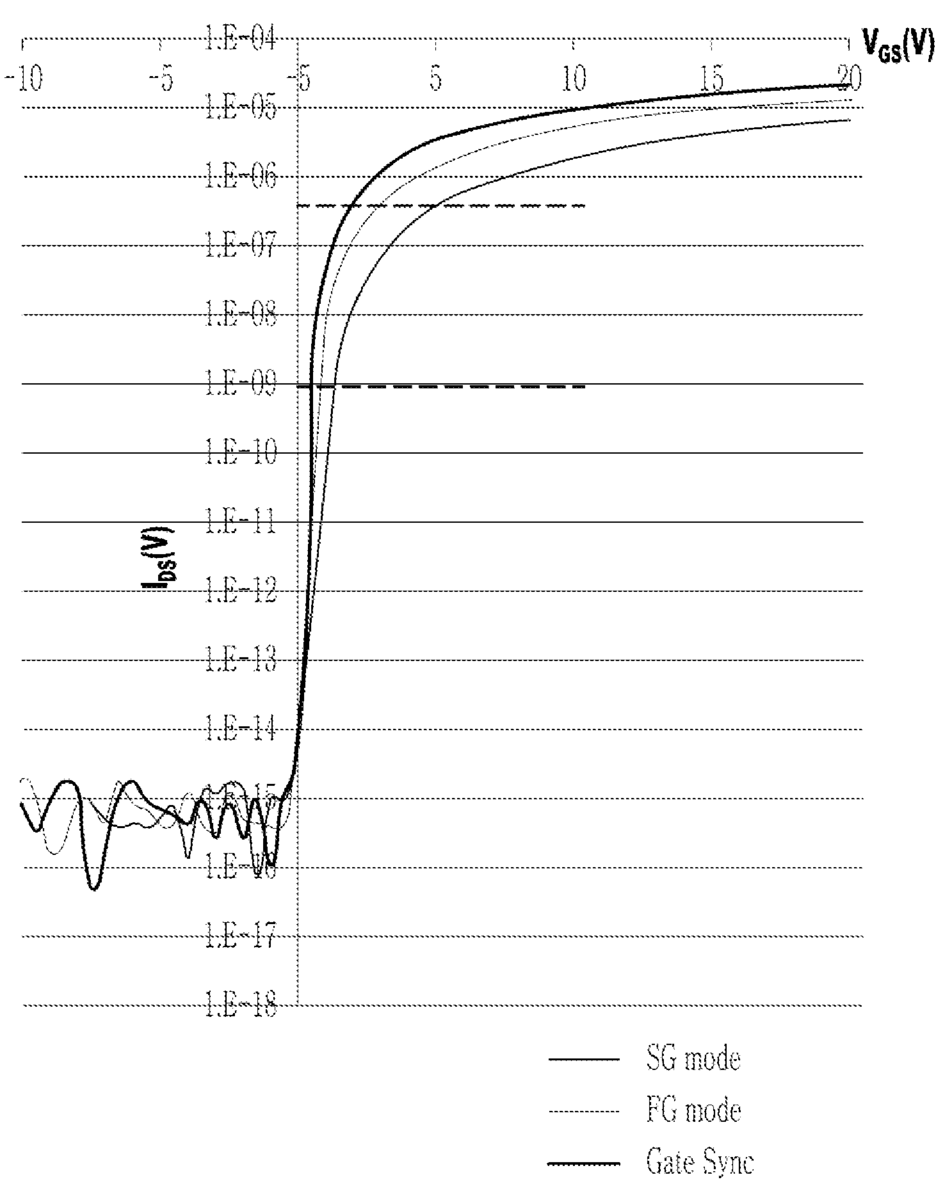

FIG. 10 and FIG. 11 are graphs showing characteristics of a driving transistor according to an embodiment.

First, in FIG. 10, the relationship between the threshold voltage $V_{t(FG)}$ of the driving transistor T1 according to the voltage $V_{SG}$ of the second driving gate electrode SG of the driving transistor T1 is shown.

In a mode of controlling the driving transistor T1 using the voltage $V_{SG}$ of the second driving gate electrode SG in which the driving transistor T1 having two gate electrodes controls (hereinafter, referred to as "SG mode"), Equation 3 below is satisfied.

$$V_{t(FG)} = V_{t(FG)}(\text{at } V_{SG}=0) + rV_{SG} \quad \text{[Equation 3]}$$

Here, $V_{t(FG)}$ (at $V_{SG}=0$) means the threshold voltage $V_{t(FG)}$ of the driving transistor T1 when the voltage $V_{SG}$ of the second driving gate electrode SG is 0, and the value of the y-intercept in FIG. 10.

In addition, r in Equation 3 is a coupling factor between the two gate electrodes and the semiconductor layer, and corresponds to the slope of the graph in a certain range (Depleted region) in FIG. 10, and the following Equation 4 is satisfied.

$$r = \frac{C_b C_{os}}{C_{of}(C_b + C_{os})} = \frac{\frac{\varepsilon_{AL}}{\varepsilon_{of}} T_{FGI}}{\frac{\varepsilon_{AL}}{\varepsilon_{os}} T_{SGI} + T_{AL}} \quad \text{[Equation 4]}$$

Here, C is denotes capacitance, ε denotes the permittivity, and T denotes the thickness.

In Equation 4, $C_{of}$ represents the capacitance between the first driving gate electrode FG and the semiconductor layer ACT, $C_{os}$ represents the capacitance between the second driving gate electrode SG and the semiconductor layer ACT, and $C_b$ represents the capacitance of the body of the semiconductor layer ACT itself, which corresponds to a value obtained by dividing the thickness of the semiconductor layer ACT by the dielectric constant.

In Equation 4, $\varepsilon_{of}$ is the dielectric constant of the second insulating layer 142 positioned on the side of the first driving gate electrode FG, $\varepsilon_{os}$ is the dielectric constant of the first insulating layer 141 positioned on the side of the second driving gate electrode SG, and $\varepsilon_{AL}$ is the dielectric constant of the semiconductor layer ACT itself.

Also, as shown in FIG. 9, $T_{FGI}$, $T_{SGI}$, and $T_{AL}$ indicate the thickness of the second insulating layer 142, the thickness of the first insulating layer 141, and the thickness of the semiconductor layer ACT, respectively.

Referring to FIG. 10 and Equation 3, when the driving transistor T1 is operated in the SG mode, the voltage $V_{SG}$ of the second driving gate electrode SG is linearly changed in a certain region (depleted region).

Therefore, it can be seen that the output of the driving transistor T1 can be adjusted by adjusting the voltage $V_{SG}$ of the second driving gate electrode SG of the driving transistor T1.

Specifically, referring to FIG. 10, when the voltage $V_{SG}$ of the second driving gate electrode SG fluctuates within a certain range depleted region, the threshold voltage $V_{tFG}$ of the driving transistor T1 can be seen to change.

As shown in FIG. 6, even if the gate-on voltage of the light-emitting signal EM is applied as a constant voltage value to the first driving gate electrode FG in the emission period, the threshold voltage $V_{t(FG)}$ of the driving transistor T1 is varied based on the voltage $V_{SG}$ of the second driving gate electrode SG, the degree to which the driving transistor T1 is turned on may be changed, and the magnitude of the output current may also be changed.

Therefore, the driving transistor T1 of FIG. 1 may operate while adjusting the output current based on the voltage $V_{SG}$ of the second driving gate electrode SG during the emission period.

In an embodiment, when manufacturing a light emitting display device, the thickness of the semiconductor layer ACT, the thickness of the second insulating layer 142, and the thickness of the first insulating layer 141 are appropriately set, so that the second driving gate electrode SG and the driving transistor T1 can be adjusted to generate an appropriate output current corresponding to the voltage $V_{SG}$.

The driving transistor T1 having two gate electrodes may satisfy Equation 5 below.

$$V_{t(FG)} \cong V_{FBf} + \psi_{sf} - \frac{Q_{depletion}}{2C_{of}} \quad \text{[Equation 5]}$$

Here, $V_{FBf}$ is a flat band voltage of the second driving gate electrode SG, which is the voltage of the first driving gate electrode FG to be no band bending in the semiconductor layer ACT of the driving transistor T1 and the net space charge therein becomes zero.

In Equation 5, $\Psi_{sf}$ denotes a relative energy level of the semiconductor layer ACT at the interface between the second insulating layer 142 on the side of the first driving gate electrode FG and the semiconductor layer ACT, and $Q_{depletion}$ is the depletion charge density at the semiconductor layer ACT, and $C_{of}$ denotes the capacitance between the first driving gate electrode FG and the semiconductor layer ACT.

Referring to Equation 5, the threshold voltage $V_{t(FG)}$ of the driving transistor T1 is the flat band voltage, the relative energy level at the interface of the semiconductor layer ACT, and the depletion charge density charge density may also have a corresponding relationship.

The above Equation 3 to Equation 5 can be confirmed in more detail with reference to the reference below.

Reference: K. Kim & J. G. Fossum, IEEE T-ED, pp. 294-299, February 2001

In the above, the characteristics of the threshold voltage $V_{t(FG)}$ of the driving transistor T1 have been described.

Hereinafter, characteristics of the output current $I_{DS}$ of the driving transistor T1 will be described with reference to FIG. 11.

FIG. 11 shows a simulation result of a change in the output current $I_{DS}$ of the driving transistor T1 versus a voltage difference $V_{GS}$ between the gate electrode and the source region S of the driving transistor T1.

Here, since there are two gate electrodes of the driving transistor T1, FIG. 11 shows graphs by simulating three cases as follows.

That is, in FIG. 11, when driving in the FG mode in which the driving transistor T1 is controlled by using the voltage of the first driving gate electrode FG, it is driven using the voltage $V_{SG}$ of the second driving gate electrode SG. Three graphs are shown separately for the case of driving in the SG mode for controlling the transistor T1 and the case of driving by applying a same voltage to both gate electrodes (hereinafter referred to as "Gate Sync mode").

In addition, in the simulation of FIG. 11, the simulation was performed under the following conditions.

The voltage difference between the source region S and the drain region D of the driving transistor T1 is set to 5.1 V, and the dielectric constant ε of the second insulating layer 142 positioned on the side of the first driving gate electrode FG is 3.80, the dielectric constant $\varepsilon_{os}$ of the first insulating layer 141 positioned on the side of the second driving gate electrode SG is 3.90, the dielectric constant $\varepsilon_{AL}$ of the semiconductor layer ACT is 10.00, and the second insulating layer 142 is 1400 angstroms (Å), the first insulating layer 141 has a thickness $T_{SGI}$ of 2600 Å, the semiconductor layer ACT has a thickness $T_{AL}$ of 400 Å, and the channel length is 6 micrometers (μm).

In FIG. 11, horizontal dotted lines indicate the cases when the output currents IDS of the driving transistor T1 are 1 nanoampere (nA) and 500 nA, respectively.

Referring to the horizontal dotted lines in FIG. 11, when the output current IDS of the driving transistor T1 is greater than or equal to 1 nA and less than or equal to 500 nA, the voltage range applied to the gate electrode of the driving transistor T1 can be confirmed. It may be as shown in Table 1 below.

TABLE 1

| modes | gate voltage range |
|---|---|
| Gate Sync mode | 1.5 V |
| FG mode | 2.5 V |
| SG mode | 4.0 V |

Table 1 shows the voltage range of the gate electrode when the output current IDS of the driving transistor T1 is changed from 1 nA to 500 nA.

In the Gate Sync mode, it can be seen that the output current IDS of the driving transistor T1 changes greatly even if the gate voltage changes slightly. In the SG mode, it can be seen that the output current $I_{DS}$ of the driving transistor T1 is relatively small compared to the variation of the gate voltage.

In addition, it can be seen that the gate voltage range in the SG mode is 1.6 times larger than the gate voltage range in the FG mode.

In addition, it can be seen that the gate voltage range in the SG mode is 2.67 times larger than that in the Gate Sync mode.

Therefore, when driving in the SG mode, that is, when controlling the output current $I_{DS}$ using the voltage of the second driving gate electrode SG, the driving transistor T1 can be controlled using the widest range of voltage. When the driving transistor T1 is controlled in the SG mode, it is possible to output various currents classified according to the voltage of the gate electrode, so it can be confirmed that the driving transistor T1 can be easily controlled.

Hereinafter, a modified embodiment of FIG. 1 and FIG. 7 will be reviewed through FIG. 12 and FIG. 13.

First, a modified embodiment of FIG. 1 will be described with reference to FIG. 12.

Figure 12:
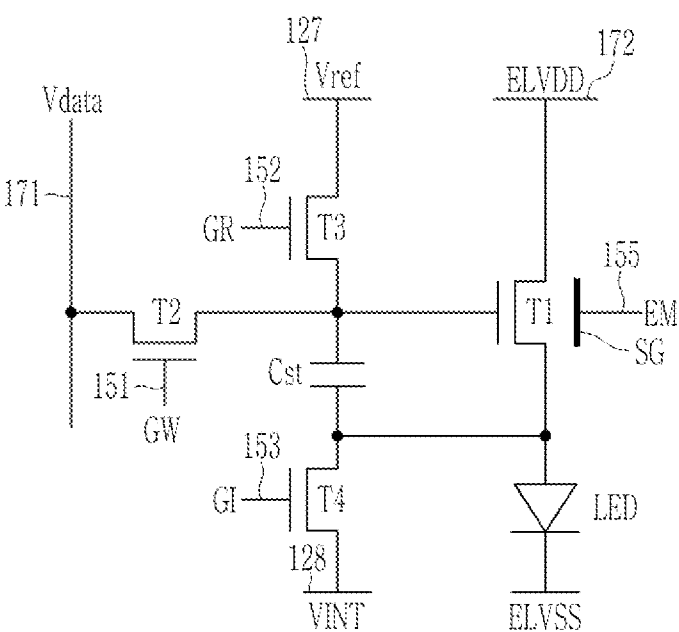
FIG. 12 is an equivalent circuit diagram of a pixel included in a light emitting display device according to an alternative embodiment.

FIG. 12 is an equivalent circuit diagram of the pixel included in a light emitting display device according to an alternative embodiment.

The pixel according to the embodiment FIG. 12 is substantially the same as the embodiment of FIG. 1 except that the second driving gate electrode SG of the driving transistor T1 receives a light emission signal EM from the emission control line 155, the first driving gate electrode is connected to the second electrode of the second transistor T2 and receives the data voltage Vdata, and is connected to the second electrode of the third transistor T3 to receive the reference voltage Vref as well, and has a structure connected to the second storage electrode of the storage capacitor Cst.

That is, in an embodiment of FIG. 12, the driving transistor T1 shows a pixel set to operate in the FG mode.

The pixel according to the embodiment of FIG. 12 may also receive the signal shown in FIG. 2 and operate as shown in FIG. 3 to FIG. 6.

That is, referring to FIG. 6, the driving transistor T1 emits an output current to the anode of the diode LED in response to the emission signal EM applied to the first driving gate electrode and the data voltage Vdata applied to the second driving gate electrode SG.

Referring to FIG. 11, it can be confirmed that the output current $I_{DS}$ of the driving transistor T1 is adjusted based on the voltage even in FG mode, so in an embodiment like FIG. 12, the output current $I_{DS}$ of the driving transistor T1 changes depending on the data voltage Vdata, and the degree of light emission of the light-emitting diode LED changes, allowing the luminance to be distinguished and displayed.

The embodiment of FIG. 12 may have a same cross-sectional structure as that of FIG. 7, and may be formed with a same number of masks as in FIG. 8.

Referring to FIG. 12, the second storage electrode of the storage capacitor Cst may be integrally formed with the first driving gate electrode FG with each other as a single unitary and indivisible part, and the first storage electrode may be integrally formed with the semiconductor layer with each other as a single unitary and indivisible part.

Hereinafter, a modified embodiment of FIG. 7 will be reviewed through FIG. 13.

Figure 13:
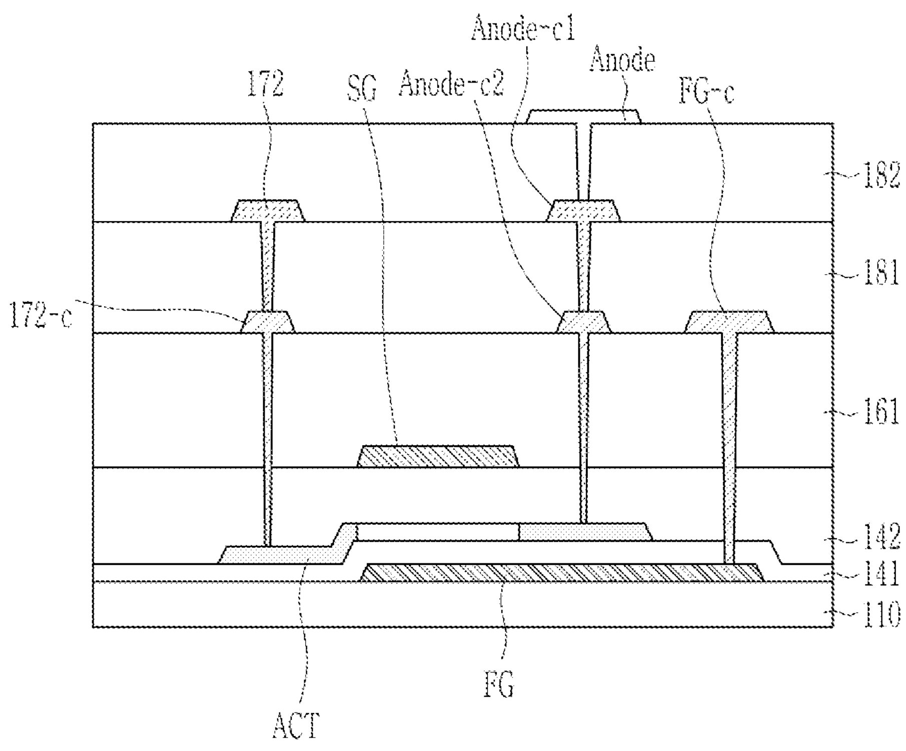
FIG. 13 is a cross-sectional view of a light emitting display device according to an alternative embodiment.

FIG. 13 is a cross-sectional view of a light emitting display device according to an alternative embodiment.

In an embodiment, as shown in FIG. 13, the second insulating layer 142 positioned above the semiconductor layer ACT is formed relatively thick, and the first insulating layer 141 positioned below the semiconductor layer ACT is formed relatively thin.

As a result, the second driving gate electrode SG is positioned on the second insulating layer 142 and the first driving gate electrode FG is formed under the first insulating layer 141.

The cross-sectional structure of FIG. 13 may be applied to both a pixel having the circuit structure of FIG. 1 or a pixel having the circuit structure of FIG. 12.

Hereinafter, a cross-sectional structure of the driving transistor T1 having two gate electrodes according to the embodiment of FIG. 13 will described in detail.

The second driving gate electrode SG and the first driving gate electrode FG are disposed or positioned above and below the semiconductor layer ACT of the driving transistor T1 to be insulated from each other.

A relatively thin first insulating layer 141 is positioned between the first driving gate electrode FG and the semiconductor layer ACT, and a second insulating layer 142 having a thick thickness is positioned between the second driving gate electrode SG and the semiconductor layer ACT.

The first driving gate electrode FG of the driving transistor T1 is positioned relatively close to the semiconductor layer ACT and can serve as a main gate electrode.

In such an embodiment, the second driving gate electrode SG of the driving transistor T1 is positioned relatively far from the semiconductor layer ACT and may serve as an auxiliary gate electrode.

As the positions of the two gate electrodes are changed from the embodiment of FIG. 7, the following features may be additionally changed.

In the embodiment of FIG. 13, a connecting electrode FG-c connected to the first driving gate electrode FG may be formed on the third conductive layer.

Here, the connecting electrode FG-c connects the first driving gate electrode FG and the emission control line 155 that transmits the emission signal EM, as in the embodiment of FIG. 1, or the embodiment of FIG. 12. As an example, the first driving gate electrode FG may be connected to a portion of another transistor e.g., a semiconductor layer or an electrode of another transistor.

Also, in the embodiment of FIG. 13, the storage capacitor Cst is formed by overlapping a portion of the semiconductor layer ACT with the second driving gate electrode SG positioned thereon, as in the embodiment of FIG. 1, or as in FIG. 12, a portion of the first driving gate electrode FG and the semiconductor layer ACT may overlap each other.

Figure 14:
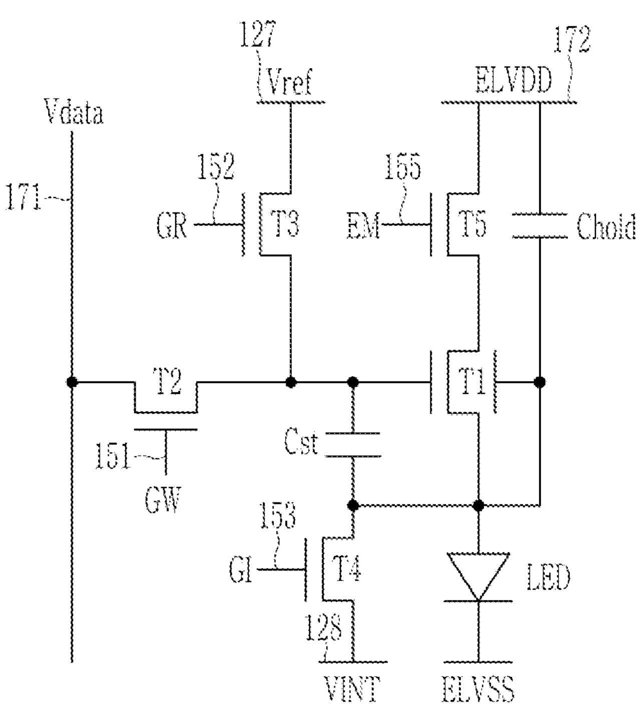
FIG. 14 is an equivalent circuit diagram of a pixel included in a light emitting display device according to a comparative example.

FIG. 14 shows a pixel circuit diagram of a comparative example.

FIG. 14 is an equivalent circuit diagram of a pixel included in a light emitting display device according to a comparative example.

Differently from the embodiments of FIG. 1 and FIG. 12, the comparative example of FIG. 14 further includes a fifth transistor T5 connected to the emission control line 155 that transmits the emission signal EM.

In the comparative example, the driving voltage line 172 and the first electrode of the driving transistor T1 are not directly connected to each other but connected to each other through the fifth transistor T5.

In the comparative example of FIG. 14, additionally, a hold capacitor Chold is also included.

Also, an overlapping electrode overlapping a channel of the semiconductor layer of the driving transistor T1 may be included.

The comparative example of FIG. 14 further includes an additional fifth transistor T5, and the fifth transistor T5 may have the following characteristics.

The fifth transistor T5 is an n-type transistor and may have an oxide semiconductor as a semiconductor layer.

The fifth transistor T5 serves to transfer the driving voltage ELVDD to the first electrode of the driving transistor T1.

A gate electrode of the fifth transistor T5 is connected to the emission control line 155, a first electrode of the fifth transistor T5 is connected to the driving voltage line 172, and the first electrode of the fifth transistor T5 is connected to the driving voltage line 172. A second electrode of the fifth transistor T5 is connected to the first electrode of the driving transistor T1.

When the fifth transistor T5 is turned on by the voltage of positive polarity among the emission signals EM flowing through the emission control line 155, the driving voltage ELVDD may be applied to the first electrode of the driving transistor T1.

As mentioned above, in the comparative example where a fifth transistor T5 and a hold capacitor Chold are included, the area occupied by a single pixel increases compared to the embodiments of FIG. 1 or FIG. 12, which inevitably leads to a decrease in the number of pixels per unit area, and may impose limitations on forming a high-resolution light emitting display device.

Therefore, as in the embodiments of FIG. 1 or FIG. 12, where the driving transistor T1 has two gate electrodes, and the driving transistor T1 adjust the magnitude of the output current output by one of which is connected to the emission control line 155 and receives the light emission signal EM, and the other gate electrode receives the data voltage Vdata, it is possible to form a high-resolution light emitting display device by forming pixels without including the fifth transistor T5.

In such embodiments, by using a portion of the semiconductor layer ACT as one side electrode of the storage capacitor Cst, the number of conductive layers is reduced and the number of masks used is reduced, thereby reducing manufacturing cost and time for the process.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting display device comprising:

a driving transistor including a first driving gate electrode, a second driving gate electrode, a first electrode, and a second electrode;

a second transistor including a gate electrode, a first electrode connected to a data line, and a second electrode connected to the second driving gate electrode;

a light emitting diode including an anode directly connected to the second electrode of the driving transistor;

a storage capacitor including a first storage electrode connected to the anode of the light emitting diode and a second storage electrode connected to the second driving gate electrode;

a driving voltage line directly connected to the first electrode of the driving transistor; and an emission control line directly connected to the first driving gate electrode.

2. The light emitting display device of claim 1, wherein the driving transistor transfers an output current to the anode of the light emitting diode based on a light emitting signal applied to the first driving gate electrode and a data voltage applied to the second driving gate electrode.

3. The light emitting display device of claim 2, further comprising:

a third transistor including a gate electrode, a first electrode connected to a reference voltage line, and a second electrode connected to the second driving gate electrode.

4. The light emitting display device of claim 3, further comprising:

a fourth transistor including a gate electrode, a first electrode connected to an initialization voltage line, and a second electrode connected to the anode and the first storage electrode.

5. The light emitting display device of claim 4, wherein each of the driving transistor, the second transistor, the third transistor, and the fourth transistor is an n-type transistor including an oxide semiconductor.

6. The light emitting display device of claim 4, further comprising:

a first scan line connected to the gate electrode of the second transistor;

a second scan line connected to the gate electrode of the third transistor; and a third scan line connected to the gate electrode of the fourth transistor.

7. The light emitting display device of claim 1, further comprising:

a first conductive layer disposed on a substrate and including the second driving gate electrode;

a first insulating layer is disposed on the first conductive layer;

a semiconductor layer disposed on the first insulating layer and including a channel of the driving transistor;

a second insulating layer disposed over the semiconductor layer; and a second conductive layer disposed on the second insulating layer and including the first driving gate electrode, where a thickness of the second insulating layer is smaller than a thickness of the first insulating layer.

8. The light emitting display device of claim 1, further comprising:

a first conductive layer disposed on a substrate and including the first driving gate electrode;

a first insulating layer disposed on the first conductive layer;

a semiconductor layer disposed on the first insulating layer and including a channel of the driving transistor;

a second insulating layer disposed over the semiconductor layer; and a second conductive layer disposed on the second insulating layer and including the second driving gate electrode;

wherein a thickness of the second insulating layer is greater than a thickness of the first insulating layer.

9. The light emitting display device of claim 1, wherein the driving transistor includes a semiconductor layer;

the semiconductor layer is integrally formed with the first storage electrode as a single unitary and indivisible part; and the second storage electrode is integrally formed with the second driving gate electrode as a single unitary and indivisible part.

10. The light emitting display device of claim 9, wherein the first storage electrode of the semiconductor layer is defined by a portion of the semiconductor layer having a conductivity to function as a conductor through an ion implantation or doping process.

11. A light emitting display device comprising:

a driving transistor including a first driving gate electrode, a second driving gate electrode, a first electrode, and a second electrode;

a second transistor including a gate electrode, a first electrode connected to a data line, and a second electrode connected to the first driving gate electrode;

a light emitting diode including an anode directly connected to the second electrode of the driving transistor;

a storage capacitor including a first storage electrode connected to the anode of the light emitting diode and a second storage electrode connected to the first driving gate electrode;

a driving voltage line directly connected to the first electrode of the driving transistor; and an emission control line directly connected to the second driving gate electrode.

12. The light emitting display device of claim 11, wherein the driving transistor transfers an output current to the anode of the light emitting diode based on a light emitting signal applied to the second driving gate electrode and a data voltage applied to the first driving gate electrode.

13. The light emitting display device of claim 12, further comprising:

a third transistor including a gate electrode, a first electrode connected to a reference voltage line, and a second electrode connected to the first driving gate electrode.

14. The light emitting display device of claim 13, further comprising:

a fourth transistor including a gate electrode, a first electrode connected to an initialization voltage line, and a second electrode connected to the anode and the first storage electrode.

15. The light emitting display device of claim 14, wherein each of the second transistor, the third transistor, and the fourth transistor is an n-type transistor including an oxide semiconductor.

16. The light emitting display device of claim 14, further comprising:

a first scan line connected to the gate electrode of the second transistor;

a second scan line connected to the gate electrode of the third transistor; and a third scan line connected to the gate electrode of the fourth transistor.

17. The light emitting display device of claim 11, further comprising:

a first conductive layer disposed on a substrate and including the second driving gate electrode;

a first insulating layer disposed on the first conductive layer;

a semiconductor layer disposed on the first insulating layer and including a channel of the driving transistor;

a second insulating layer disposed over the semiconductor layer; and a second conductive layer disposed on the second insulating layer and including the first driving gate electrode;

wherein a thickness of the second insulating layer is smaller than a thickness of the first insulating layer.

18. The light emitting display device of claim 11, further comprising:

a first conductive layer disposed on a substrate and including the first driving gate electrode;

a first insulating layer disposed on the first conductive layer;

a semiconductor layer disposed on the first insulating layer and including a channel of the driving transistor;

a second insulating layer disposed over the semiconductor layer; and a second conductive layer disposed on the second insulating layer and including the second driving gate electrode, wherein a thickness of the second insulating layer is greater than that of a first insulating layer.

19. The light emitting display device of claim 11, wherein the driving transistor includes a semiconductor layer, the semiconductor layer is integrally formed with the first storage electrode as a single unitary and indivisible part, and the second storage electrode is integrally formed with the first driving gate electrode as a single unitary and indivisible part.

20. The light emitting display device of claim 19, wherein the first storage electrode of the semiconductor layer is defined by a portion of the semiconductor layer having a conductivity to function as a conductor through an ion implantation or doping process.

* * * * *